US009865493B2

(12) United States Patent
Yoshioka et al.

(10) Patent No.: US 9,865,493 B2
(45) Date of Patent: Jan. 9, 2018

(54) SUBSTRATE PLATING JIG (71) Applicant: JCU CORPORATION, Taito-ku (JP)

(72) Inventors: Junichiro Yoshioka, Kanagawa (JP); Takashi Murayama, Kanagawa (JP)

(73) Assignee: JCU CORPORATION, Taito-ku (JP)

( * ) Notice: Subject to any disclaimer, the term of this patent is extended or adjusted under 35 U.S.C. 154(b) by 264 days.

(21) Appl. No.: 14/441,648

(22) PCT Filed: Nov. 14, 2012

(86) PCT No.: PCT/JP2012/079519
§ 371 (c)(1),
(2) Date: May 8, 2015

(87) PCT Pub. No.: WO2014/076781
PCT Pub. Date: May 22, 2014

(65) Prior Publication Data
US 2015/0294894 A1    Oct. 15, 2015

(51) Int. Cl.
*H01L 21/687* (2006.01)
*C25D 17/06* (2006.01)
*C25D 17/00* (2006.01)

(52) U.S. Cl.
CPC ...... *H01L 21/68721* (2013.01); *C25D 17/001* (2013.01); *C25D 17/06* (2013.01)

(58) Field of Classification Search
CPC .......... C25D 7/12–7/126; C25D 17/001; C25D 17/06–17/08; H01L 21/28721
(Continued)

(56) References Cited

U.S. PATENT DOCUMENTS 8,236,151 B1    8/2012   Olson et al.
2002/0029963 A1    3/2002   Yoshioka et al.
(Continued)

FOREIGN PATENT DOCUMENTS

CN    1233880 C    12/2005
CN    101295033 A    10/2008
(Continued)

OTHER PUBLICATIONS

Machine translation for Yamamoto (JP 2004-277815).*
(Continued)

*Primary Examiner* — Luan V Van
*Assistant Examiner* — Alexander W Keeling
(74) *Attorney, Agent, or Firm* — Oblon, McClelland, Maier & Neustadt, L.L.P.

(57) ABSTRACT

A plating jig that can form a metal plating film simultaneously on both surfaces of a semiconductor wafer by one plating process. The plating jig includes a base section and a cover section that can hold a substrate to be plated, and a center section that holds the substrate between the base section and cover section; the base section, the cover section and the center section each having an annular portion having an opening at a center thereof; seal packings each having a conductive ring disposed thereon being attached to each of facing surfaces of the annular portions of the base section and the cover section; the substrate to be plated being disposed inside the opening of the center section; and the substrate to be plated being held from front and back surfaces thereof with the seal packings attached to the cover section and the center section.

8 Claims, 7 Drawing Sheets (58) Field of Classification Search
USPC .................................................. 414/935–941
See application file for complete search history.

(56) References Cited

U.S. PATENT DOCUMENTS

| | | |
|---|---|---|
| 2003/0192782 A1 | 10/2003 | Yamamoto |
| 2014/0024178 A1* | 1/2014 | Scanlan ................. C25D 17/06 |
| | | 438/127 |

FOREIGN PATENT DOCUMENTS

| | | | |
|---|---|---|---|
| JP | 4-325699 A | | 11/1992 |
| JP | 6-207300 A | | 7/1994 |
| JP | 2001-247999 A | | 9/2001 |
| JP | 2003-301299 A | | 10/2003 |
| JP | 2004-277815 A | | 10/2004 |
| JP | 2004277815 A | * | 10/2004 |
| JP | 2008-184692 A | | 8/2008 |
| JP | 4764899 B2 | | 9/2011 |

OTHER PUBLICATIONS

International Search Report dated Dec. 25, 2012 in PCT/JP2012/079519 filed Nov. 14, 2012.
Combined Chinese Office Action and Search Report dated Jul. 26, 2016 in Patent Application No. 201280076998.2 (with English translation of categories of cited documents).

* cited by examiner

SUBSTRATE PLATING JIG

TECHNICAL FIELD

The present invention relates to a plating jig used for plating a substrate, and particularly relates to a plating jig for forming a plating film on a fine wiring groove or hole and a resist opening provided on a plating surface of a semiconductor wafer or the like, and for forming a bump (protrusion electrode), which electrically connects a semiconductor chip and a substrate, on a plating surface of a semiconductor wafer.

BACKGROUND ART

An ordinary plating jig has a holding member that holds a substrate, such as a semiconductor wafer, in such a manner that an outer peripheral surface and a back surface of the semiconductor wafer are sealed, and a front surface (plating surface) thereof is exposed, and the plating surface is plated by immersing the holding member in a plating solution along with the substrate.

However, an electrolytic plating method using the ordinary plating jig has a problem that only one surface of a semiconductor wafer may be plated by one plating process, and thus the operation time is necessarily doubled for plating both the surfaces of the semiconductor wafer, which may adversely affect the in-plane uniformity of the plating thickness of the semiconductor wafer.

Under the circumstances, PTL 1 describes a plating jig having a substrate holding mechanism that holds a substrate to be plated in such a manner that the entire region of the edge portion of the substrate to be plated is sealed against a plating solution, and simultaneously the prescribed regions surrounded by the seal on both surfaces of the substrate to be plated are exposed to a plating solution. According to the use of the substrate plating jig, the prescribed regions surrounded by the seal on both the surfaces of the substrate to be plated are in contact with a plating solution, and a metal plating film may be formed simultaneously on the prescribed regions surrounded by the seal on both the surfaces of the substrate to be plated, which may solve the aforementioned problem.

In the plating jig described in PTL 1, however, the holding member itself has a certain thickness since the guide pins for positioning the substrate and the like are partially embedded therein, which may adversely affect the uniformity of plating. Furthermore, the plating jig includes a large number of members, which may increase the cost and may make the operation for replacing the seal complicated.

PTL 1: Japanese Patent No. 4,764,899

SUMMARY OF INVENTION

Technical Problem

Accordingly, an object of the invention is to solve the problem of the ordinary plating jig, and to provide a plating jig that is capable of forming a metal plating film simultaneously on both surfaces of a semiconductor wafer by one plating process, and has a simple structure with a thinner holding member.

Solution to Problem

The invention is to solve the problem and relates to a plating jig that contains a base section and a cover section that are formed to be capable of holding a substrate to be plated, and a center section that positions the substrate to be plated by being held between the base section and cover section; the base section, the cover section and the center section each having an annular portion having an opening at a center thereof; seal packings each having a conductive ring disposed thereon being attached to each of facing surfaces of the annular portion of the base section and the annular portion of the cover section; the substrate to be plated being disposed inside the opening of the center section; and the substrate to be plated being held from front and back surfaces thereof with the seal packings attached to the cover section and the center section.

The invention also relates to the plating jig that further contains a clamp section that is formed interfittably to outer edges of the base section, the cover section and the center section.

Advantageous Effects of Invention

According to the plating jig of the invention, not only a metal plating film may be formed simultaneously on both surfaces of a semiconductor wafer by one plating process, but also the thickness of the holding member may be further reduced by the structure containing the base section and the cover section holding the substrate and the center section positioning the substrate, and a plating solution flow along the surface of the substrate to be plated may be further uniformed.

According to the plating jig of the invention, furthermore, the operation of replacing the seals may be facilitated only by replacing the annular seal packings.

DESCRIPTION OF EMBODIMENTS

Embodiments of the plating jig of the invention will be described specifically with reference to the drawings. The invention is not limited to the embodiments.

Figure 1:
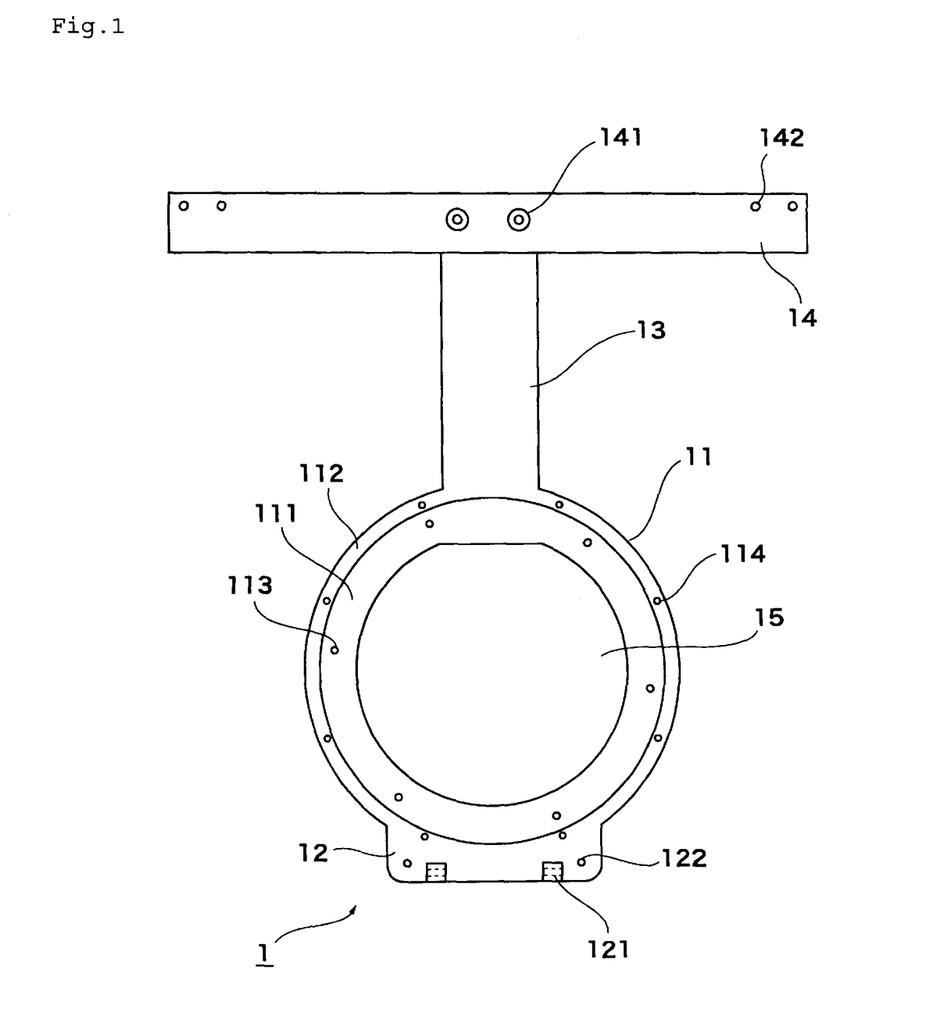
FIG. 1 is a front view of a base section of a plating jig of the invention.
Figure 2:
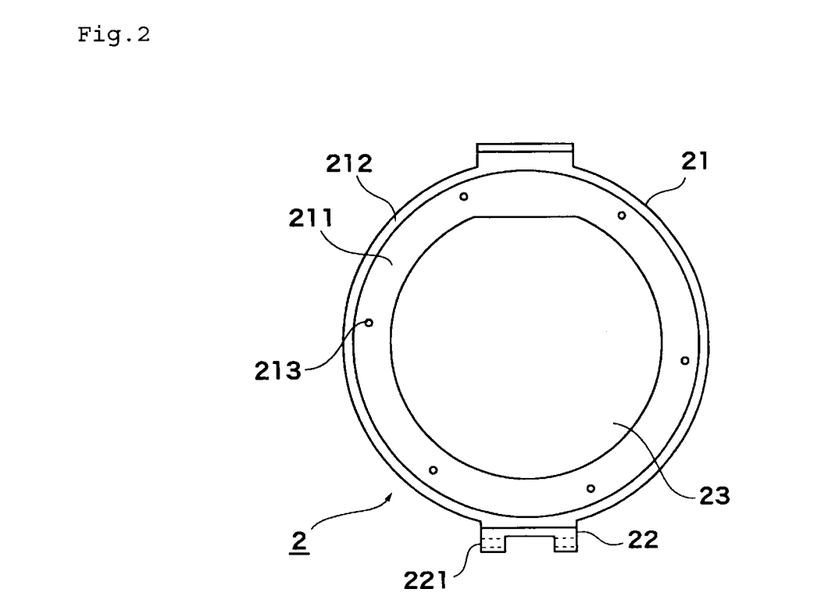
FIG. 2 is a front view of a cover section of a plating jig of the invention.
Figure 3:
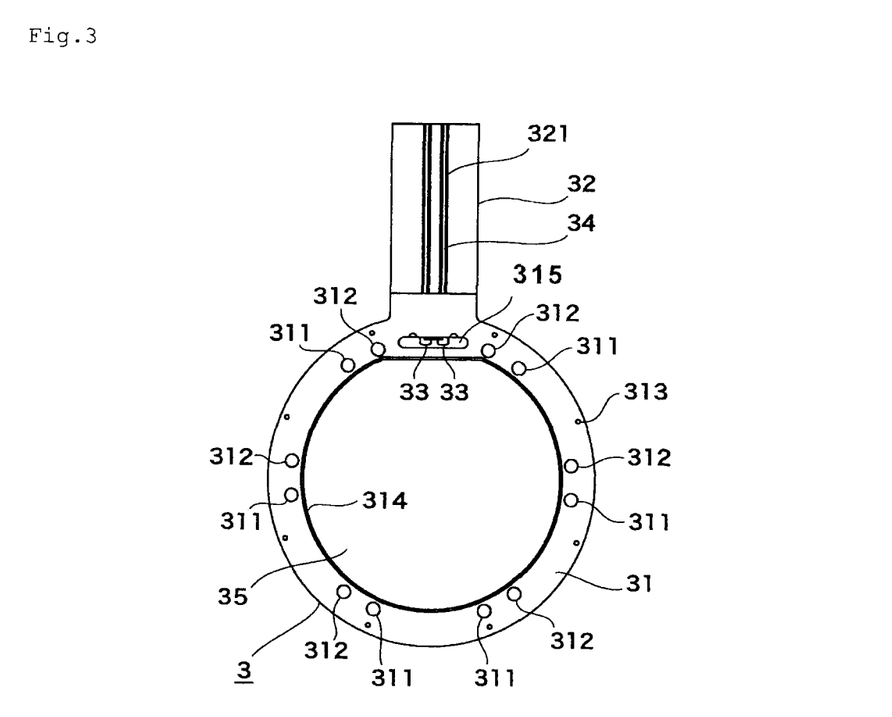
FIG. 3 is a front view of a center section of a plating jig of the invention.
Figure 4:
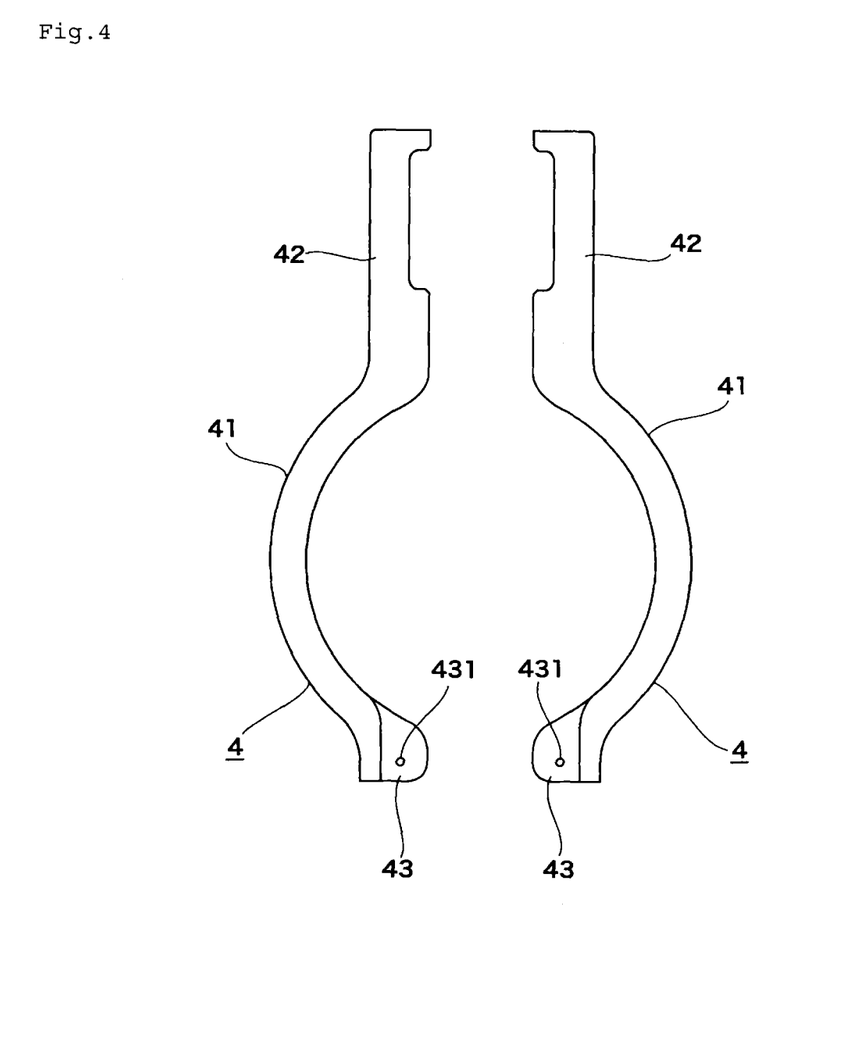
FIG. 4 is a front view of a clamp section of a plating jig of the invention.
Figure 5:
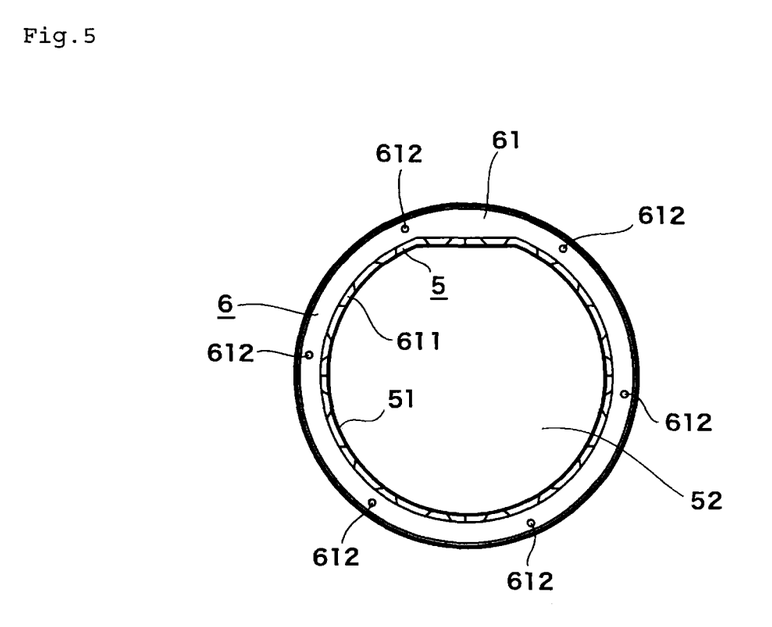
FIG. 5 is a front view of a seal packing having a conductive ring disposed therein inside a plating jig of the invention.
Figure 6:
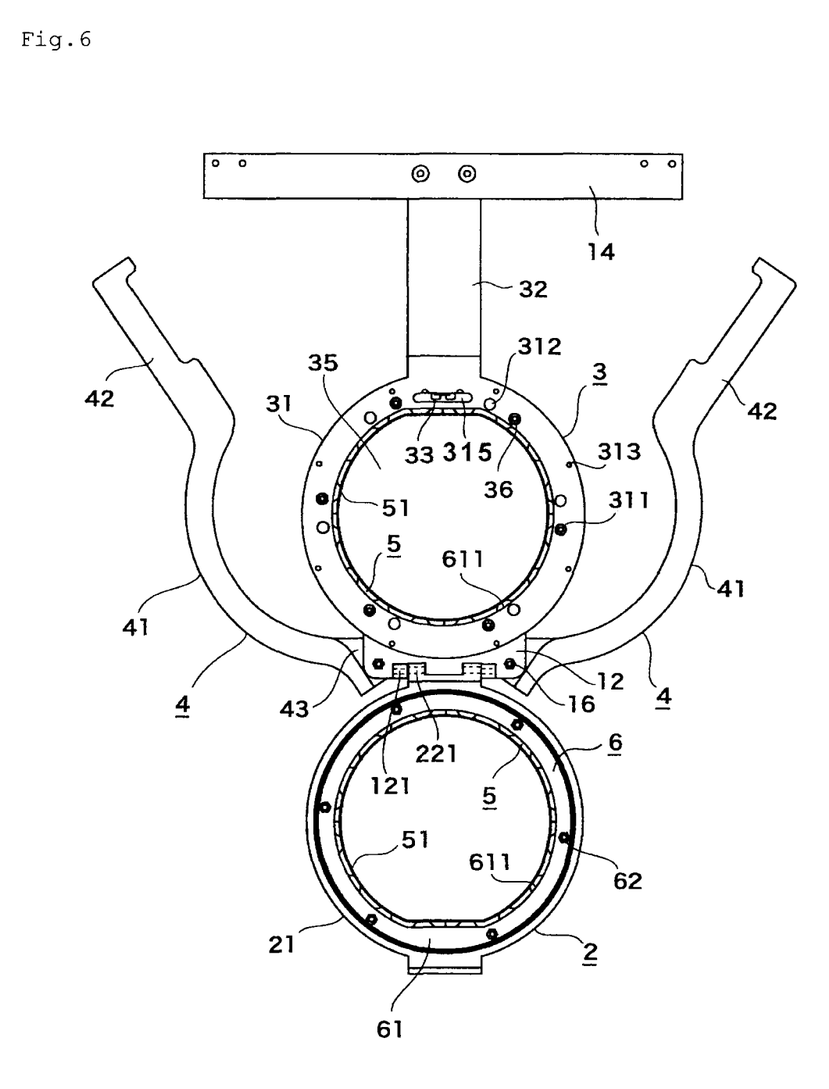
FIG. 6 is a front view of a plating jig of the invention, in which a clamp section thereof is opened, and a cover section thereof is opened.
Figure 7:
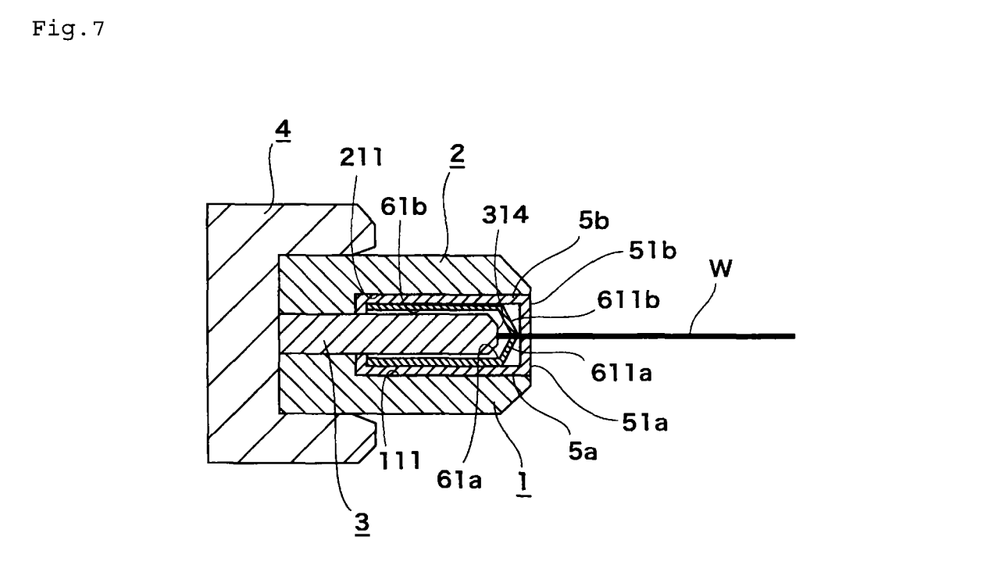
FIG. 7 is a partially enlarged cross sectional view of a plating jig of the invention having a substrate held thereby.

FIG. 1 is a front view of a base section of a plating jig of the invention, FIG. 2 is a front view of a cover section of a plating jig of the invention, FIG. 3 is a front view of a center section of a plating jig of the invention, FIG. 4 is a front view of a clamp section of a plating jig of the invention, FIG. 5 is a front view of a seal packing 5 having a conductive ring 6 disposed therein, FIG. 6 is a front view of a plating jig of the invention after the fabrication thereof, in which a clamp section 4 and the cover section 2 thereof are opened, and FIG. 7 is a partially enlarged cross sectional view of a plating jig of the invention having a substrate W held thereby.

The basic constitution of the plating jig of the invention includes abase section 1 and a cover section 2 that hold a substrate to be plated, a center section 3 that positions the substrate to be plated by being held between the two sections, and a clamp section 4 that holds the outer edges of the base section 1, the cover section 2 and the center section 3 while holding the substrate to be plated. The sections will be described in detail below.

FIG. 1 is a front view of the base section 1 of the plating jig of the invention. As shown in the figure, the base section 1 of the embodiment has an annular portion 11 that is formed in an annular shape and has an opening 15 at the center thereof, an arm portion 13 that extends upward from the upper part of the annular portion 11, a handle portion 14 that is attached to and extends in the horizontal direction from the upper end of the arm portion 13, and a connecting portion 12 that is provided at the lower part of the annular portion 11.

On an inner edge of the annular portion 11, a seal packing attaching portion 111 having a counterbore is formed to be recessed by one step from an outer edge portion 112. The seal packing attaching portion 111 has formed therein bolt holes 113 used on attaching the seal packing 5, and the outer edge portion 112 has formed therein screw holes 114 used on attaching the center section 3 to the base section 1.

The arm portion 13 is formed in a plate form, a part of which on the upper end thereof is inserted into the interior of the handle portion 14 and fixed to the handle portion 14 with fixing bolts or the like at a fixing portion 141. The handle portion 14 has around the both ends thereof screw holes 142 for fixing a metal fitting for providing connection to external electric power. The connecting portion 12 has bolt holes 122 used on attaching the clamp section 4 and hinge portions 121 used on attaching a cover section 2.

FIG. 2 is a front view of the cover section of the plating jig of the invention. As shown in the figure, the cover section 2 of the embodiment has an annular portion 21 that is formed in an annular shape and has an opening 23 at the center thereof, and a connecting portion 22 at the lower part of the annular portion 21.

On an inner edge of the annular portion 21, a seal packing attaching portion 211 having a counterbore is formed to be recessed by one step from an outer edge portion 212. The seal packing attaching portion 211 has formed therein bolt holes 213 used on attaching the seal packing 5.

FIG. 3 is a front view of the center section 3 of the plating jig of the invention. As shown in the figure, the center section 3 of the embodiment has an annular portion 31 that is formed in an annular shape and has an opening 35 at the center thereof, and an arm portion 32 that extends upward from the upper part of the annular portion 31. The opening 35 of the center section 3 has an inner dimension that is determined to fit to the outer dimension of the substrate to be plated for positioning the substrate.

The annular portion 31 is formed to be a flat annular shape except for a part of the inner edge portion thereof that is chamfered, and the inner edge portion has formed therein bolt receiving holes 311 and bolt receiving holes 312, in which fixing bolts for attaching the seal packing 5 to the base section 1 and the cover section 2 are inserted. The outer edge portion thereof has formed therein screw holes 313 used on attaching the center section 3 to the base section 1. The annular portion 31 located under the arm portion 32 has formed therethrough a conducting opening 315.

The arm portion 32 has a groove portion 321 recessed therefrom, in which conducting bars 34 are capable of being disposed, and a hole portion (which is not shown in the figure) for disposing the conducting bars therein connecting the groove portion 321 continuously to the conducting opening 315 located thereunder is formed inside the annular portion 31. The lower ends of the conducting bars 34 disposed through from the groove portion 321 to the conducting opening 315 are exposed inside the conductive opening 315, and contact members 33 are disposed on the exposed part to be capable of being in contact with the conductive ring 6. The groove portion 321 is preferably masked with a polyvinyl chloride plate or tape, or the like, after disposing the conducting bars 34, for preventing the groove portion 321 from being exposed to the plating solution.

FIG. 4 is a front view of the clamp section 4 of the plating jig of the invention. The clamp section 4 is formed to have a substantially U-shaped cross sectional shape, and has a semi-annular external portion 41 that is capable of being fit to the outer edges of the annular portions 11, 21 and 31 of the base section 1, the cover section 2 and the center section 3, and an arm external portion 42 that is capable of being fit to the side edges of the arm portions 13 and 32 of the base section 1 and the center section 3. The semi-annular external portion 41 has formed in the lower part thereof connecting portions 43 each having a bolt hole 431 used on attaching the clamp section 4 to the base section 1. In this embodiment, the base section 1 and the cover section 2 are fixed to each other by fitting the clamp section 4 to the outer edges thereof, but the method for fixing the cover section 2 is not limited thereto, and ordinary measures, such as a fixing bolt or screw, may be used.

FIG. 5 is a front view of the seal packing 5 having the conductive ring 6 disposed therein. The seal packing 5 has an opening 52 at the center thereof, and is formed to be an annular shape that is capable of being attached to the seal packing attaching portions 111 and 211 of the base section 1 and the cover section 2, and the cross sectional shape thereof is formed to be a substantially U shape, inside which the conducting ring 6 is capable of being disposed. While not shown in the figure, the seal packing 5 has, at the positions corresponding to the bolt holes 113 of the base section 1 and the bolt holes 213 of the cover section 2, the similar bolt holes formed therein. The seal packing 5 is formed of a rubber material, such as silicone rubber.

The conducting ring 6 disposed in the seal packing 5 has an annular portion 61 formed in an annular shape that is capable of being housed inside the seal packing 5, and the inner edge portion thereof has plural electrode contacts 611 that protrude obliquely upward toward the opening 52. The annular portion 61 has formed therein bolt holes 612 used on attaching the seal packing 5 and the conducting ring 6 to the base section 1 and the cover section 2.

FIG. 6 is a front view of the plating jig of the invention after fabricating the sections thereof, in which the clamp section 4 and the cover section 2 thereof are opened. As shown in the figure, the right and left parts of the clamp section 4 are disposed freely pivotally with fixing bolts 16 to the right and left sides with respect to the base section 1. The cover section 2 is disposed freely pivotally with hinge portions 221 and the hinge portions 121 back and forth with respect to the base section 1. In the state shown in the figure, the clamp section 4 is opened to the right and left sides, and the cover section 2 is opened to the front side (downward in the figure).

The center section 3 is disposed and carried on the upper surface of the base section 1. In this case, head parts of fixing bolts 36 for attaching the seal packing 5 to the base section 1 are inserted into the bolt receiving holes 311 of the center section 3. As shown in the figure, the most part of the base section 1 is hidden by the center section 3, and the seal packing 5 and the conducting ring 6 attached to the base section 1 are partially exposed and viewed through the opening 35 of the center section 3.

As shown in the figure, the seal packing 5 and the conducting ring 6 are attached to the cover section 2. The seal packing 5 and the conducting ring 6 are attached to the screw holes 213 of the cover section 2 with fixing bolts 62, and the head parts of the fixing bolts 62 are inserted into the bolt receiving holes 312 of the center section 3 on closing the cover section 2.

The substrate to be plated is fixed and retained from the state shown in FIG. 6 in the following manner. Firstly, the substrate to be plated is disposed inside the opening 35 of the center section 3, and the outer edge portion of the substrate is carried on protrusions 51 on the inner periphery of the seal packing 5 attached to the base section 1. Then, the cover section 2 is closed and overlaid on the center section 3. In this case, the substrate to be plated is held from the back and front surfaces thereof with the seal packing 5 attached to the cover section 2 and the seal packing 5 attached to the base section 1. In this state, the right and left parts of the clamp section 4 are closed and fit to the outer edges of the base section 1, the cover section 2 and the center section 3. According to the procedures, the operation of fixing and holding the substrate is completed.

FIG. 7 is a partially enlarged cross sectional view of the plating jig of the invention having the substrate W held thereby. As shown in the figure, the center section 3 is held between the base section 1 and the cover section 2, and in this state, the semi-annular external portion 41 of the clamp section 4 having a substantially U-shaped cross section is fit to the outer edges thereof. In this case, an inner peripheral end portion 314 of the center section 3 is set back toward the outer periphery thereof from the inner peripheral end portions of the base section 1 and the cover section 2, and thereby a part of the peripheral portion of the substrate W thus held intervenes in the space between the base section 1 and the cover section 2 and is in contact with the inner peripheral end portion 314 of the center section 3.

The seal packings 5 are attached to the seal packing attaching portions 111 and 211 disposed on the facing surfaces of the base section 1 and the cover section 2, and the protrusions 51a and 51b on the inner peripheries thereof protrude from the inner peripheral end portions of the base section 1 and the cover section 2. The substrate W is held and fixed on the peripheral portion thereof from the front and back surfaces thereof with the protrusions 51a and 51b on the inner peripheries.

As described above, the substrate to be plated is held from the front and back surface thereof with the protrusions 51 on the inner peripheries of the seal packings 5, and thereby the part of the substrate W that is outer than the held part is sealed to prevent the plating solution from invading into the seal packings 5, retaining the water tightness. The part of the substrate W that is not sealed with the seal packings 5 is exposed to the plating solution, and thus a plating film is formed simultaneously on both the front and back surfaces. Furthermore, for positioning the substrate in the plating jig of the invention, it is sufficient only to make the outer peripheral end portion of the substrate in contact with the inner peripheral end portion 314 of the center section 3. The center section 3 is formed to be a flat annular shape, which makes the total thickness of the holding member smaller, and thereby the plating solution flow along the surface of the substrate to be plated may be further uniformed.

A method of feeding electric power to the substrate to be plated in the plating jig of the invention will be described. Electric power is fed from an external electric power source to the two conducting bars 34 disposed in the arm portion 32, through the conducting path provided inside or on the surface of the handle portion 14 of the base section 1. As described above, the lower parts of the conducting bars 34 are provided through the conducting opening 315, and the contact members 33 are disposed on the end portions thereof. The contact members 33 are provided one by one on the conducting bars 34, and in the state where the substrate is held, the contact members 33 are disposed in such a manner that one of them is in contact with the conducting ring 6 attached to the base section 1, whereas the other one thereof is in contact with the conducting ring 6 attached to the cover section 2. According to the configuration, electric power is fed respectively to the conducting rings 6 attached to the base section 1 and the cover section 2 through the conducting bars 34 and the contact members 33.

Electric power is further fed from the conducting rings 6 to the substrate W through the electrode contacts 611. As shown in FIG. 7, the annular portions 61a and 61b of the conducting rings 6 attached to the base section 1 and the cover section 2 have the electrode contacts 611a and 611b protruding obliquely upward toward the opening 52, and in the state where the substrate W is held, the tip ends of the electrode contacts 611a and 611b are in contact with the front and back surfaces of the substrate W. According to the configuration, electric power is fed to the front and back surfaces of the substrate W. The aforementioned electric power feeding method is preferred since electric power is reliably fed to the substrate W while preventing the conducting rings 6 from being exposed to the plating solution with the seal packings 5, but the electric power feeding method with the plating jig of the invention is not limited thereto.

REFERENCE SIGN LIST 1 base section
2 cover section
3 center section
4 clamp section
5 seal packing
6 conducting ring
11 annular portion
12 connecting portion
13 arm portion
14 handle portion
15 opening
16 fixing bolt
21 annular portion
22 connecting portion
23 opening
31 annular portion
32 arm portion
33 contact member
34 conducting bar
35 opening
36 fixing bolt
41 semi-annular external portion
42 arm external portion
43 connecting portion 51 protrusion on inner periphery
52 opening
61 annular portion
62 fixing bolt
111 seal packing attaching portion
112 outer edge portion
113 bolt hole
114 screw hole
121 hinge portion
122 bolt hole
141 fixing portion
142 screw hole
211 seal packing attaching portion
212 outer edge portion
213 bolt hole
221 hinge portion
311 bolt receiving hole
312 bolt receiving hole
313 screw hole
314 inner peripheral end portion
315 conducting opening
321 groove portion
431 bolt hole
611 electrode contact
612 bolt hole
W substrate

The invention claimed is:

1. A plating jig comprising:
a base section and a cover section that are formed to hold a substrate to be plated; and
a center section that positions the substrate to be plated by holding the substrate between the base section and cover section,
wherein
the base section, the cover section and the center section each has an annular portion having, an opening at a center thereof,
seal packings, each having a conductive ring disposed thereon, are attached to each of facing surfaces of the annular portion of the base section and the annular portion of the cover section,
the substrate to be plated is disposed inside the opening of the center section,
the substrate to be plated is held from front and back surfaces thereof with the seal packings attached to the cover section and the base section, and
the center section has an arm portion that extends upward from an upper part of the annular portion thereof, the arm portion has a groove portion recessed therefrom, in which a conducting bar is capable of being disposed, the annular portion thereof has formed therethrough a conducting opening, and the conducting bar is disposed through from the groove portion to the conductive opening.

2. The plating jig according to claim 1, wherein the seal packing has a substantially U-shaped cross sectional shape and holds the substrate to be plated with protrusion on an inner periphery thereof.

3. The plating jig according to claim 1, wherein the conductive ring is formed in an annular shape that is housed inside the seal packing, and an inner edge portion thereof has plural electrode contacts that protrude obliquely upward and are in contact with a front or back surface of the substrate to be plated.

4. The plating jig according to claim 1, wherein the substrate to be plated is held in such a manner that an outer peripheral end portion of the substrate to be plated is in contact with an inner peripheral end portion of the annular portion of the center section.

5. The plating jig according to claim 1, wherein an inner peripheral end portion of the center section is set back toward an outer periphery thereof from inner peripheral end portions of the base section and the cover section.

6. The plating jig according to claim 1, wherein a lower end of the conducting bar is exposed inside the conductive opening, and a contact member is disposed on the exposed part to be capable of being in contact with the conductive ring.

7. The plating jig according to claim 1, wherein the plating jig further comprises a clamp section that is formed interfittably to outer edges of the base section, the cover section and the center section while holding the substrate to be plated.

8. The plating jig according to claim 7, wherein the clamp section is disposed freely pivotally to right and left sides with respect to the base section, and the cover section is disposed freely pivotally back and forth with respect to the base section.

* * * * *